US010614733B2

(12) United States Patent
Cai et al.

(10) Patent No.: US 10,614,733 B2
(45) Date of Patent: Apr. 7, 2020

(54) DISPLAY PANEL, METHOD FOR DETECTING THE SAME AND DETECTION SYSTEM

(71) Applicants: BOE TECHNOLOGY GROUP CO., LTD., Beijing (CN); HEFEI XINSHENG OPTOELECTRONICS TECHNOLOGY CO., LTD., Anhui (CN)

(72) Inventors: Zhenfei Cai, Beijing (CN); Yongqian Li, Beijing (CN); Can Yuan, Beijing (CN); Xuehuan Feng, Beijing (CN)

(73) Assignees: BOE TECHNOLOGY GROUP CO., LTD., Beijing (CN); HEFEI XINSHENG OPTOELECTRONICS TECHNOLOGY CO., LTD., Anhui (CN)

( * ) Notice: Subject to any disclaimer, the term of this patent is extended or adjusted under 35 U.S.C. 154(b) by 0 days.

(21) Appl. No.: 16/134,680

(22) Filed: Sep. 18, 2018

(65) Prior Publication Data
US 2019/0088180 A1  Mar. 21, 2019

(30) Foreign Application Priority Data
Sep. 19, 2017  (CN) .......................... 2017 1 0856173

(51) Int. Cl.
*G09G 3/36* (2006.01)
*G09G 3/00* (2006.01)
(Continued)

(52) U.S. Cl.
CPC ........... *G09G 3/006* (2013.01); *G09G 3/3225* (2013.01); *H01L 27/124* (2013.01); *G09G 2300/0426* (2013.01); *G09G 2300/0842* (2013.01)

(58) Field of Classification Search
CPC ...................................................... G09G 3/006
(Continued)

(56) References Cited

U.S. PATENT DOCUMENTS

2005/0110733 A1* 5/2005 Sasaki .................. G09G 3/3644
345/87
2008/0129327 A1  6/2008 Kim
(Continued)

FOREIGN PATENT DOCUMENTS

CN        101191910 A    6/2008
TW        201102730 A    1/2011

OTHER PUBLICATIONS

First Office Action issued in corresponding Chinese Application No. 201710856173.7, dated Jan. 19, 2020, with English translation.

*Primary Examiner* — Roy P Rabindranath
(74) *Attorney, Agent, or Firm* — McDermott Will & Emery LLP

(57) ABSTRACT

A display panel includes M drive groups disposed side by side in a display area, and M pad groups disposed in a wiring area around the display area. Each pad group includes N data detection terminals. Each drive group includes a plurality of columns of pixel units, and each pixel unit includes N sub-pixels. N≥3, M≥2, and M and N are positive integers. Each data detection terminal is configured to receive a signal output from a detection device. The pad groups are in one-to-one correspondence with the drive groups. Sub-pixels having same color in a drive group of the drive groups are electrically connected to a data detection terminal of one of the pad groups corresponding to the drive group via a same one of data lines.

12 Claims, 5 Drawing Sheets

(51) Int. Cl.
*G09G 3/3225* (2016.01)
*H01L 27/12* (2006.01)

(58) Field of Classification Search
USPC .......................................................... 345/100
See application file for complete search history.

(56) References Cited

U.S. PATENT DOCUMENTS

| 2011/0007062 A1* | 1/2011 | Chang | G09G 3/3614 345/213 |
| 2015/0379937 A1* | 12/2015 | Kim | G09G 3/006 345/691 |
| 2016/0064465 A1* | 3/2016 | Oh | H01L 27/3262 257/43 |

* cited by examiner

DISPLAY PANEL, METHOD FOR DETECTING THE SAME AND DETECTION SYSTEM

CROSS-REFERENCE TO RELATED APPLICATION

This application claims priority to Chinese Patent Application No. 201710856173.7, filed on Sep. 19, 2017, titled "A DISPLAY PANEL, METHOD FOR DETECTING THE SAME AND DETECTION SYSTEM", the entire content of which is hereby incorporated by reference.

TECHNICAL FIELD

The present disclosure relates to the field of display technologies, and in particular, to a display panel, a method for detecting the same and a detection system.

BACKGROUND

As a current-mode light-emitting device, Organic Light Emitting Diode (OLED) or Light Emitting Diode (LED) is increasingly used in the high-performance display field due to its characteristics such as self-illumination, fast response, wide viewing angle and the ability of being fabricated on a flexible substrate, and etc.

SUMMARY

In one aspect, a display panel is provided, and the display panel includes M drive groups disposed side by side in a display area and M pad groups disposed in a wiring area around the display area. Each drive group includes a plurality of columns of pixel units, and each pixel unit includes N sub-pixels, wherein, N is greater than or equal to 3, M is greater than or equal to 2, and M and N are positive integers. Each pad group includes N data detection terminals, and each data detection terminal is configured to receive a signal output by a detection device. The pad groups are in one-to-one correspondence with the drive groups. Sub-pixels having same color in a drive group of the drive groups are electrically connected to a data detection terminal of one of the pad groups corresponding to the drive group via data lines.

In some embodiments, the display panel further includes a plurality of read detection terminals disposed in the wiring area, and a plurality of read lines. Each read line is connected to one of the plurality of read detection terminals, and pixel circuits of sub-pixels in each pixel unit is connected to a same read line. The read line is configured to collect threshold voltages of drive transistors in the pixel circuits, and output the threshold voltages to the detection device via a corresponding read detection terminal.

In some embodiments, the display panel further includes a plurality of short wirings in the wiring area. An end of each short wiring is connected to a corresponding one of the data detection terminals, and an opposite end is connected to a corresponding one of the data lines.

In some embodiments, the display panel further includes gate lines disposed in the display area. The gate lines and the data lines intersect, and are in a same layer and of a same material.

In some embodiments, a pixel circuit of each sub-pixel in the display area includes a first switch sub-circuit, a second switch sub-circuit, a drive sub-circuit and a light-emitting device, and the drive sub-circuit includes a drive transistor. The first switch sub-circuit is connected to a data line for controlling the sub-pixel, a first gate line of the gate lines and a gate electrode of the drive transistor, and is configured to output a data voltage provided by the data line to the gate electrode of the drive transistor under a control of the first gate line. The second switch sub-circuit is connected to a read line, a second gate line of the gate lines and a second electrode of the drive transistor, and is configured to output a voltage of the second electrode of the drive transistor to the read line under a control of the second gate line. A first electrode of the drive transistor is connected to a first voltage end, the second electrode of the drive transistor is further connected to an anode electrode of the light-emitting device, and a cathode electrode of the light-emitting device is connected to a second voltage end.

In some embodiments, the first switch sub-circuit includes a first transistor. A gate electrode of the first transistor is connected to the first gate line, a first electrode of the first transistor is connected to the data line and a second electrode of the first transistor is to the gate electrode of the drive transistor.

In some embodiments, the second switch sub-circuit includes a second transistor. A gate electrode of the second transistor is connected to the second gate line, a first electrode of the second transistor is connected to the second electrode of the drive transistor, and a second electrode of the first electrode is connected to the read line.

In some embodiments, the drive sub-circuit further includes a storage capacitor. A first end of the storage capacitor is connected to the electrode gate of the drive transistor, and an opposite end is connected to the second electrode of the drive transistor In some embodiments, the display panel further includes a plurality of gate detection terminals disposed in the wiring area. Each gate detection terminal is connected to a first gate line or a second gate line of the gate lines, and the gate detection terminals are configured to receive gate signals output from the detection device.

In another aspect, a detection system is provided, and the detection system includes any one of the display panels described above and a detection device. The detection device includes at least one source driver electrically connected to the pad groups in the display panel.

In some embodiments, the at least one source driver includes a plurality of the source drivers arranged side by side. The source drivers are in one-to-one correspondence with the drive groups in the display panel, and each source driver is connected to data detection terminals in a pad group corresponding to a corresponding drive group.

In some embodiments, the display panel includes read signal terminals. Each source driver is electrically connected to read lines connected to pixel circuits of sub-pixels in a drive group corresponding to the source driver via read signal terminals.

In some embodiments, the detection device further includes a plurality of gate drivers arranged side by side. The display panel includes gate detection terminals, and each gate driver is connected to a plurality of gate detection terminals of the gate detection terminals arranged sequentially. Gate detection terminals electrically connected to any two of the plurality of gate drivers are different.

In another aspect, a method for detecting any one of the display panels described above is provided. The display panel includes read lines, first gate lines and second gate lines, and pixel circuits of sub-pixels include drive transistors. The method includes: outputting gate signals to the first gate lines and the second gate lines row by row; receiving sequentially data voltages output by the detection device by a plurality of data detection terminals in the pad groups, when a first gate line and a second gate line receive gate signals; receiving a reset voltage output from the detection device by a read line, when one of data detection terminals in each of the pad groups receives a data voltage; collecting a voltage of second electrode of drive transistor by the read line, and outputting the voltage via the read detection terminal when the drive transistor is cut off.

BRIEF DESCRIPTION OF THE DRAWINGS

The accompanying drawings described herein are used to provide a further understanding of the present disclosure and constitute a part of the present disclosure. The illustrative embodiments and descriptions serve to explain the present disclosure, but do not constitute a limitation to the present disclosure. In the accompanying drawings:

FIG. 6 is a schematic structural diagram of the pixel circuit of the sub-pixel in FIG. 1a;

DETAILED DESCRIPTION

Technical solutions in embodiments of the present disclosure will be described clearly and completely with reference to the accompanying drawings in the embodiments of the present disclosure. Obviously, the described embodiments are merely some but not all embodiments of the present disclosure. All other embodiments made on the basis of the embodiments of the present disclosure by a person of ordinary skill in the art without paying any creative effort shall be included in the protection scope of the present disclosure.

In the preparation process of an OLED or LED display device, it is necessary to detect threshold voltages of some Thin Film Transistors (TFTs), such as drive transistors, in a display panel of the display device after a vacuum align process, to detect whether this display panel is qualified.

In related art, a detection device is electrically connected to each of the data lines in the display panel through a corresponding probe to implement the detection of the threshold voltages described above. However, as the Pixels Per Inch (PPI) of the panel increases gradually, the number of the data lines also increases greatly, resulting in a small distance between two adjacent data lines. For example, for a Ultra High Definition Television (UHD) display panel, the number of the data lines can reach 3840×(4+1)=19200. In this case, the distance between two adjacent data lines is about 15 μm. At this time, 19,200 probes need to be in contact with 19,200 data lines in one-to-one correspondence to electrically connect the detection device to the data lines through the probes during the detection process. In this way, a problem of misalignment of probes may occur, thereby reducing the accuracy of the detection result.

Figure 1A:
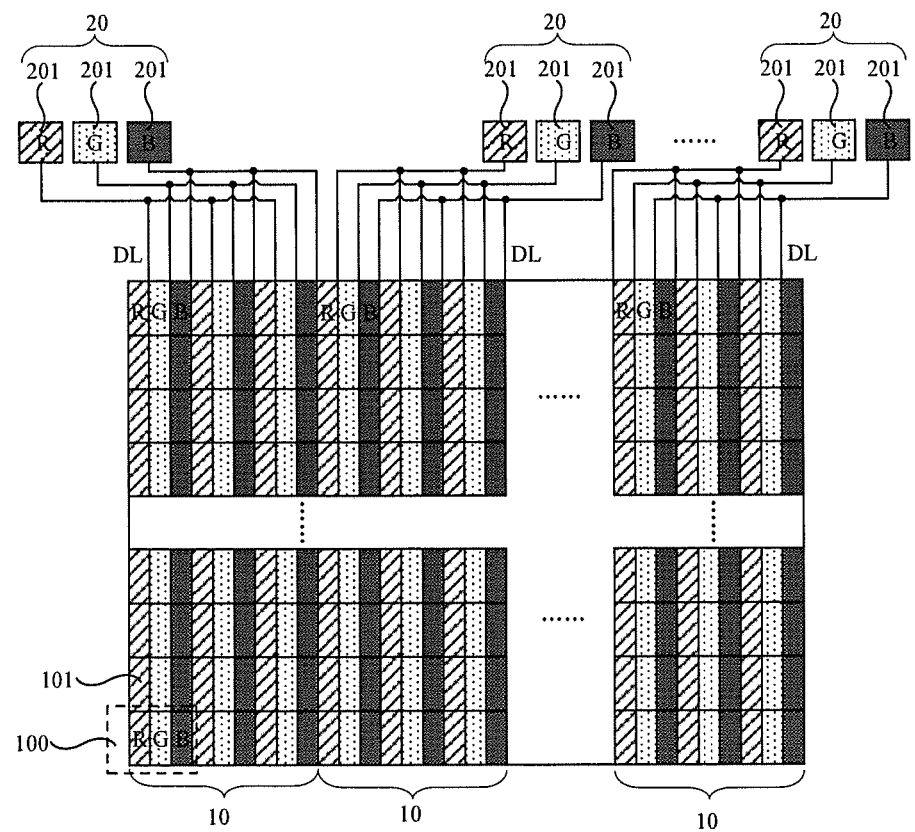
FIG. 1a is a schematic structural diagram of a display panel according to some embodiments of the present disclosure.
Figure 1B:
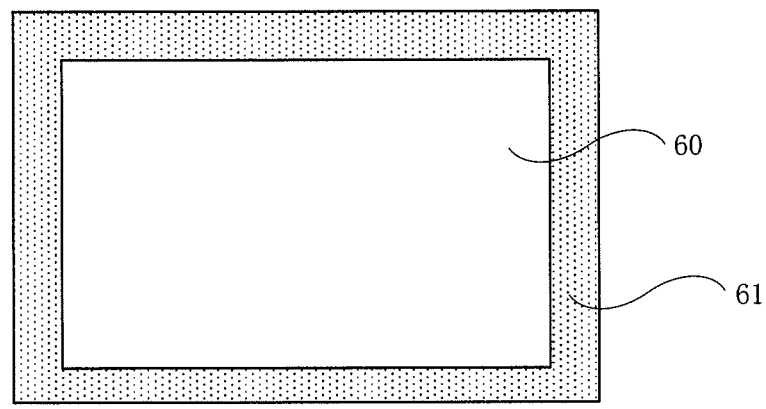
FIG. 1b is a region division diagram of a display panel according to some embodiments of the present disclosure.

Regarding the above problem, some embodiments of the present disclosure provide a display panel 01. The display panel is for example an OLED display panel or a LED display panel. As shown in FIG. 1b, the display panel 01 is for example divided into a display area 60 and a writing area 61 around the display area 60. Alternatively, the display panel 01 has a display area 60 and a writing area 61 around the display area 60. As shown in FIG. 1a, the display panel includes M drive groups 10 arranged side by side in the display area 60, and each drive group 10 includes a plurality of columns of pixel units 100. Each pixel unit 100 includes N sub-pixels 101, where N≥3, M≥2, and M and N are positive integers.

It will be noted that, in some embodiments, one column of pixel units 100 refer to a group of pixel units 100 composed of pixel units 100 to which the plurality of sub-pixels 101 connected to a same data line DL belong. As can be seen from the above description, one pixel unit 100 includes N sub-pixels 101, and thus one column of pixel units 100 include N columns of sub-pixels 101; and each column of sub-pixels 101 is connected to a same data line DL.

In this case, the pixel units 100 in the one column of pixel units 100 are for example vertically arranged in a matrix or in other shapes, and the arrangement shape of the one column of pixel units is not limited in the present disclosure, but all of the likely arrangement shapes of one column of pixel units 100 are within the range of the present disclosure.

In some embodiments, N=3, i.e., each pixel unit 100 includes three sub-pixels 101. The three sub-pixels 101 are for example a red (R) sub-pixel, a green (G) sub-pixel and a blue (B) sub-pixel, respectively, as shown in FIG. 1a. Alternatively, the three sub-pixels 101 are a cyan sub-pixel, a magenta sub-pixel and a yellow sub-pixel, respectively.

In some other embodiments, N=4, i.e., each pixel unit 100 includes four sub-pixels 101. The four sub-pixels 101 are for example a red (R) sub-pixel, a green (G) sub-pixel, a blue (B) sub-pixel and a white (W) sub-pixel, respectively. Alternatively, the four sub-pixel 101 are a red (R) sub-pixel, a green (G) sub-pixel, a blue (B) sub-pixel and a yellow (Y) sub-pixel, respectively.

In some embodiments, sub-pixels connected to the same data line DL are in the same color, that is, the color of the same column of sub-pixels 101 is the same.

The above description is merely examples of the configuration of the sub-pixels 101 in a pixel unit 100, and the present disclosure is not limited thereto.

Based on this, as shown in FIG. 1a, the display panel 01 further includes M pad groups 20 disposed in the wiring area 61. Each pad group 20 includes N data detection terminals 201 each of which is configured to receive a signal, such as a data voltage Vdata, output by a detection device 02 (shown in FIG. 6).

In some embodiments, each data detection terminal 201 is a pad. The data detection terminal 201 is capable of being electrically connected with the detection device 02 by contacting a probe of the detection device 02. In addition, the pad groups 20 are in one-to-one correspondence with the drive groups 10. Sub-pixels 101 emitting light of the same color in a drive group 10 are electrically connected to a data detection terminal 201 of a corresponding pad group 20 through a same data line DL.

Figure 7:
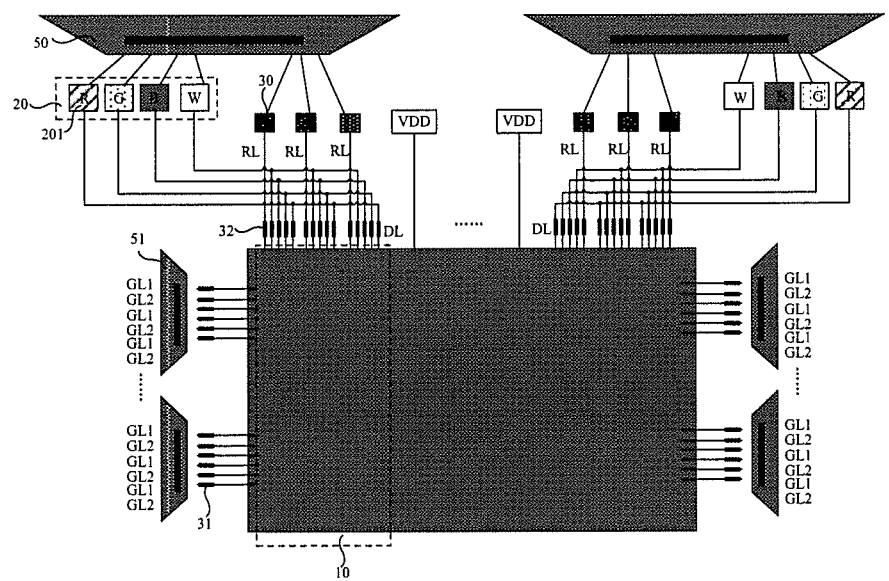
FIG. 7 is a schematic structural diagram of a detection system according to some embodiments of the present disclosure.

In some embodiments, as shown in FIG. 7, the detection device 02 includes at least one source driver (IC) 50, and each source driver 50 is for example electrically connected to a plurality of data detection terminals 201 of a pad group 20 corresponding to a drive group 10 via a plurality of probes, so that the source driver 50 may provide the data voltages Vdata for the data detection terminals 201. After the data detection terminals 201 receive the data voltages Vdata, the data detection terminals 201 transmit the data voltages Vdata to the data lines DL which are electrically connected to the data detection terminals 201.

It can be seen from the above that the number of data detection terminals 201 included in a pad group 20 is N, and the number of sub-pixels 101 of one pixel unit 100 in a drive group 10 corresponding to the pad group 20 is also N. In this case, for example, in the case where one pixel unit 100 in a drive group 10 includes three sub-pixels 101 (for example, R, G, B), the pad group 20 corresponding to the drive group 10 includes three data detection terminals 201, as shown in FIG. 1*a*. One data detection terminal 201 (R) is configured to be electrically connected with all red (R) sub-pixels 101 in the drive group 10, another data detection terminal 201 (G) is configured to be electrically connected with all green (G) sub-pixels 101 in the drive group 10, and yet another data detection terminal 201 (B) is configured to be electrically connected with all blue (B) sub-pixels 101 in the drive group 10.

Figure 2:
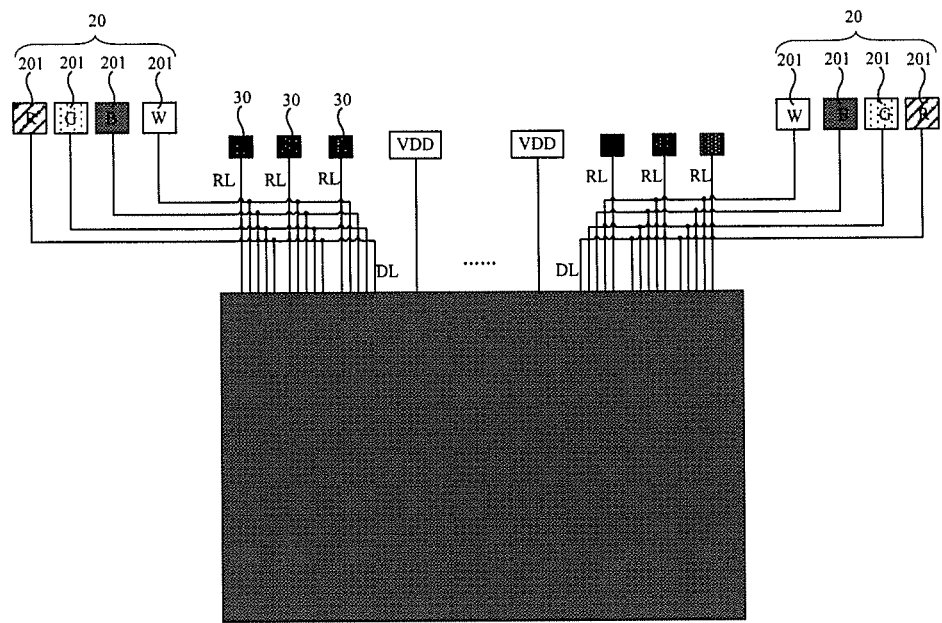
FIG. 2 is a schematic structural diagram of another display panel based on the structure shown in FIG. 1a according to some embodiments of the present disclosure.

Alternatively, for example, in the case where one pixel unit 100 in a drive group 10 includes four sub-pixels 101 (for example, R, G, B, W), the pad group 20 corresponding to the drive group 10 includes four data detection terminals 201, as shown in FIG. 2. One data detection terminal 201 (R) is configured to be electrically connected with all red (R) sub-pixels 101 in the drive group 10, another data detection terminal 201 (G) is configured to be electrically connected with all green (G) sub-pixels 101 in the drive group 10, yet another data detecting terminal 201 (B) is configured to be electrically connected with all blue (B) sub-pixels 101 in the drive group 10, and yet another data detection terminal 201 (W) is configured to be electrically connected with all white (W) sub-pixels 101 in the drive group 10.

In summary, one pad group 20 corresponds to one drive group 10, and the sub-pixels 101 of the same color in the drive group 10 are connected to a data detection terminal 201 of the pad group 20 through the data lines DL. The number N of the detection terminals 201 in the pad group 20 is equal to the number N of the sub-pixels 101 in the pixel unit 100, so as to ensure that the sub-pixels 101 of each color in a drive group 10 are electrically connected to the same data detection terminal 201 in a corresponding pad group 20.

Based on this, one source driver 50 in the detection device 02 may correspond to one drive group 10. In this case, one source driver 50 in the detection device 02 may be electrically connected to its corresponding drive group 10 by respectively connecting N probes, such as only three probes shown in FIG. 1*a*, to three data detection terminals 201 of one pad group 20. In this way, there is no need to directly connect probes to data lines DL, thereby reducing the number of the probes. In addition, by increasing the distance between two adjacent data detection terminals 201 in each pad group 20, the purpose of increasing the distance between two adjacent probes may also be achieved. Therefore, the probability of misalignment of probes may be reduced, thereby improving the accuracy of detection of threshold voltage.

In some embodiments, in order to realize the detection of the threshold voltages of drive transistors Md in the sub-pixels 101, as shown in FIG. 2, the display panel 01 further includes a plurality of read detection terminals 30 disposed in the wiring area 61. Furthermore, the display panel 01 includes a plurality of read lines RL.

Each read line RL is connected to one of the plurality of read detection terminal 30. The read line RL is configured to collect the threshold voltages or mobility of the drive transistors Md in the sub-pixels 101 connected with the read line RL, and output it to the detection device 02 through the read detection terminal 30.

In this way, the read detection terminals 30 may be connected to the detection device 02 through probes, so that the detection device may receive the threshold voltages collected by the read lines RL.

Figure 3:
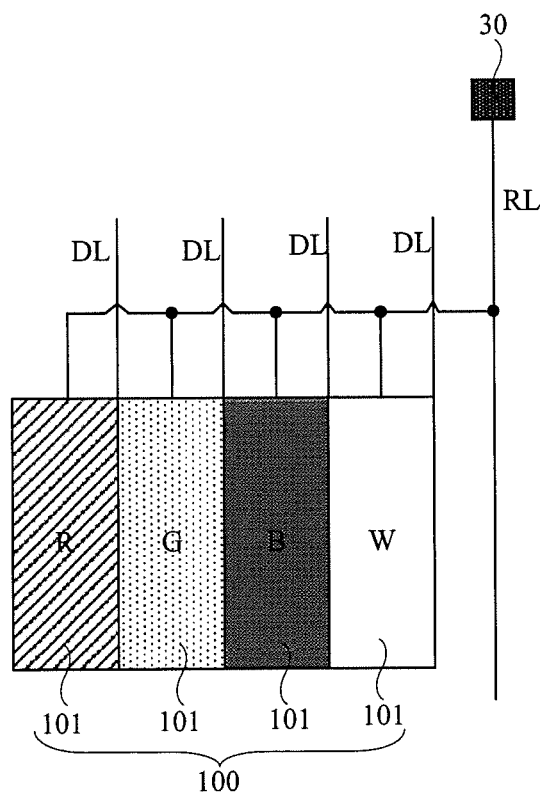
FIG. 3 is a schematic diagram showing a connection relationship between read lines and sub-pixels in FIG. 2.

In some embodiments, in order to reduce the number of wirings in the display area and to improve the aperture ratio, as shown in FIG. 3, pixel circuits of sub-pixels 101 in a same pixel unit 100 are connected to a same read line RL. In this way, it is not necessary to connect each sub-pixel 101 to a read line RL, thereby reducing the number of wirings in the display area.

In this case, the process of detecting the threshold voltage will be described by taking an example in which the threshold voltage of a drive transistor is detected.

For a pixel unit 100, the sub-pixels 101 of different colors in the pixel unit 100 are for example detected at different times.

In some embodiments, N=4, i.e., each pixel unit 100 includes four sub-pixels 101, and data voltages Vdata are sequentially supplied to the data lines DL electrically connected to four data detection terminals 201 of one pad group 20 via the four data detection terminals 201. For example, as shown in FIG. 2, data voltages Vdata are supplied to the data lines DL electrically connected to the four data detection terminals 201 of one pad group 20 from left to right via the data detection terminals 201.

In this case, during the process of scanning the sub-pixels 01 row by row, the data line DL connected to one column of red (R) sub-pixels may first receive the data voltage Vdata. At this time, a red (R) sub-pixel of the one column of red sub-pixels in the scanned row of the sub-pixels 101 is detected, and the threshold voltage collected by the read line RL is the threshold voltage of the drive transistor Md in the red (R) sub-pixel of the row of sub-pixels 101.

Next, the data lines DL respectively connected to one column of green (G) sub-pixels, one column of blue (B) sub-pixels, and one column of white (W) sub-pixels sequentially receive the data voltages Vdata. At this time, a green (G) sub-pixel, a blue (B) sub-pixel, and a white (W) sub-pixel in the scanned row of sub-pixels 101 are sequentially detected, so that the detection device 02 sequentially receives the threshold voltages of the drive transistors Md in the green (G) sub-pixel, the blue (B) sub-pixel, and the white (W) sub-pixel in the scanned row of sub-pixels 101 via a same read line RL.

Figure 4:
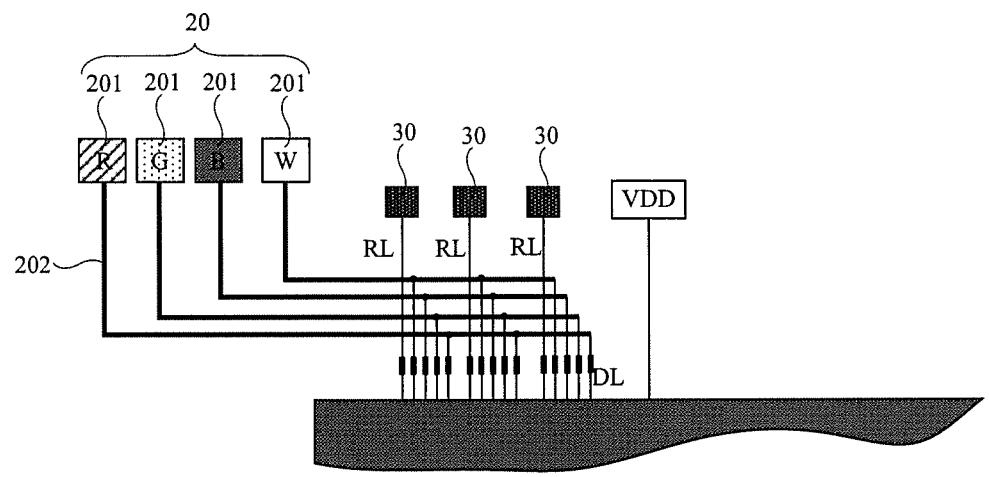
FIG. 4 is a schematic diagram showing a connection relationship between data lines and data detection terminal in FIG. 2.

It can be seen from the above that multiple data lines DL need to be electrically connected to one data detection terminal 201 of the pad group 20. In order to electrically connect the data lines DL with the data detection terminal in the pad group 20, in some embodiments, as shown in FIG. 4, the display panel 01 includes a plurality of short wirings 202 disposed in the wiring area 61.

For example, one end of each short wiring 202 is connected to a data detection terminal 201 of the pad group 20, and an opposite end is connected to a data line DL connected to the sub-pixels 101 having the same color in the drive group 10. In this case, a data detection terminal 201 of a pad group 20 may be electrically connected to a data line DL through a short wiring 202. At this time, there is no need to excessively extend the length of the data line DL in the wiring area 61.

The short wirings 202 and the data lines DL are for example disposed in different layers. In this case, the data lines DL do not need to form corners to in the case where they connect with the data detection terminals 201, so that the number of the corners in the wiring area may be reduced, which reduce the risk of tip discharge.

Based on this, the display panel 01 further includes gate lines GL disposed in the display area 60, which intersect the data lines DL. The short wirings 202 and the gate lines are for example of the same material and in the same layer. In this way, the preparation of the short wirings 202 may be completed while the gate lines GL are formed.

Alternatively, in order to directly connect the data lines DL with the data detection terminals 201, in some other embodiments, the length of the data lines DL in the wiring area 61 are extended.

It will be noted that the above-mentioned sub-pixels 101 are delimited by the intersections of the gate lines GL and the data lines DL. Therefore, the data lines DL connected to the sub-pixels 101 refer to data lines for delimiting the sub-pixels 101.

The preparation process of the display panel 01 will be detailed below by taking the display panel 01 being an OLED display panel as an example.

Figure 5:
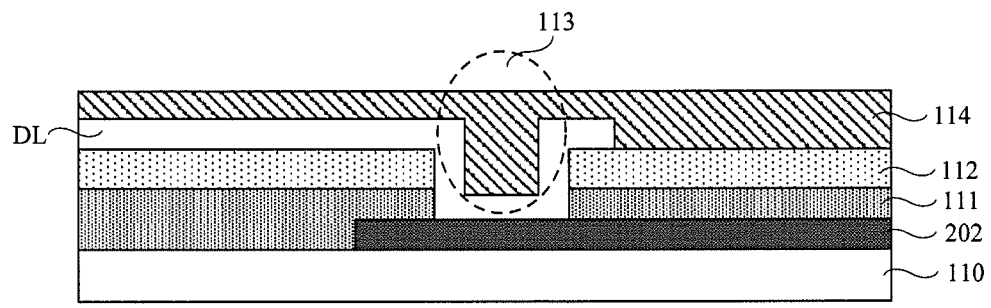
FIG. 5 is a schematic diagram showing a connection relationship between short wirings and data lines in FIG. 4.

First, as shown in FIG. 5, a gate metal layer is deposited on a base substrate 110, and then a single patterning process is performed for the gate metal layer to form a plurality of gate lines GL and the short wirings 202.

In some embodiments, the patterning process refers to a process including a photolithographic technology, or including both of the photolithographic technology and an etching step, or further including technology for forming a predetermined pattern such as printing, inkjet or the like. The photolithographic technology refers to a technology for forming a pattern by using photoresist, mask, exposure machine and the like, and including technology such as film formation, exposure, development, etc. The patterning process can be chosen according to the structures formed in the embodiments of the present disclosure.

The single pattering process is described by taking an example in which different exposure regions are formed by a single mask exposure process, and then a removal process such as multiple etching, ashing and the like is performed for the different exposure regions to finally obtain the desired pattern.

Next, a gate insulation layer GI 111 and a semiconductor active material layer are deposited on the base substrate 110 on which gate lines GL and short wirings 202 have been formed. Then semiconductor active layers (IGZO) of TFTs in pixel circuits of sub-pixels 101 are formed by performing a patterning process for the semiconductor active material layer.

Next, an etch stop material layer 112 is formed on the base substrate 110 on which the above-mentioned structure has been formed, and a patterning process is performed for the etch stop material layer 112 to form a etch stop layer (ESL) over the semiconductor active layer of the TFT. The etch stop layer is configured to protect the semiconductor active layer during the fabrication of the source electrode and the drain electrode of the TFT.

Next, the etch stop material layer 112 is photoetched at the positions corresponds to the short wirings 202, and then the gate insulating layer 111 is etched by a dry etching process at the positions, to finally form via holes 113.

Next, a data metal layer is deposited on the base substrate 110 on which the above-mentioned structure has been formed, and then a patterning process is performed for the data metal layer to form data lines DL. The data lines DL are connected with the short wirings 202 through the via holes 113, thereby being electrically connected with the data detection terminals 201 of the pad groups 20 by the short wirings 202.

At last, a passivation layer (PVX) 114 is formed on the base substrate 110 on which the above structure has been formed, and an organic light-emitting layer (EL), a hole layer, an electron layer, and the like for constituting an OLED device are formed on a surface of the passivation layer 114 facing away from the base substrate 110.

In addition, in some embodiments, a color filter layer is formed on the base substrate 100 on which the organic light-emitting layer has been formed, for realizing color display when the organic light-emitting layer in the OLED panel is used for emitting white light.

In addition, in some embodiments, in order to finish the preparation of the OLED device, a cathode layer composed of transparent conductive material, such as ITO is formed, and an insulation layer is formed on a side of the cathode layer close to the base substrate 110.

The exemplary structure of a pixel circuit of each sub-pixel 101 will be described below.

Figure 6:
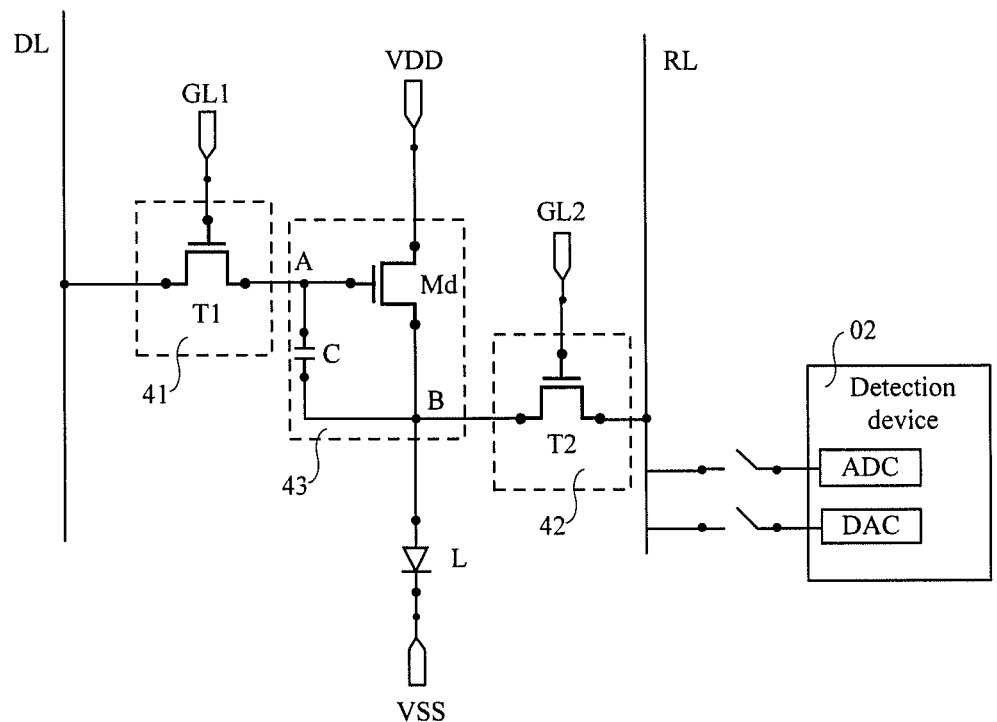

In some embodiments, as shown in FIG. 6, the pixel circuit includes a first switch sub-circuit 41, a second switch sub-circuit 42, a drive sub-circuit 43 and a light-emitting device L. The drive sub-circuit 43 includes a drive transistor.

The first switch sub-circuit 41 is connected to a data line DL for delimiting the sub-pixel 101, and a first gate line GL1, and is connected to a gate electrode of the drive transistor Md. The first switch sub-circuit 41 is configured to output the data voltage Vdata from the data line DL to the gate electrode of the drive transistor Md under the control of the first gate line GL1.

For example, the first switch sub-circuit 41 includes a first transistor T1, or a plurality of first transistors T1 in parallel.

A gate electrode of the first transistor T1 is connected to the first gate line GL1, a first electrode is connected to the data line DL, and a second electrode is connected to the gate electrode of the drive transistor Md.

In addition, the second switch sub-circuit 42 is connected to a read line RL, a second gate line GL2 and a second electrode of the drive transistor Md. The second switch sub-circuit 42 is configured to output the voltage of the second electrode of the drive transistor Md to the read line RL under the control of the second gate line GL2.

For example, the second switch sub-circuit 42 includes a second transistor T2, or a plurality of second transistors T2 in parallel.

A gate electrode of the second transistor T2 is connected to the second gate line GL2, a first electrode of the second transistor T2 is connected to the second electrode of the drive transistor Md, and a second electrode of the second transistor T2 is connected to the read line RL.

In addition, a first electrode of the drive transistor Md is connected to a first voltage terminal VDD, and the second electrode of the drive transistor Md is also connected to an anode electrode of the light-emitting device L. A cathode electrode of the light-emitting device L is connected to a second voltage terminal VSS.

On the basis of this, the drive sub-circuit 43 further includes a storage capacitor C, a first end of which is connected to the gate electrode of the drive transistor Md, and an opposite end is connected to the second electrode of the drive transistor Md.

It will be noted that the transistors described above are for example N-type transistors, or P-type transistors. The first electrode of each of the transistors is a drain electrode, and the second electrode is a source electrode. Alternatively, the first electrode of each of the transistors described above is a source electrode, and the second electrode is a drain electrode. Hereinafter, the embodiments are described by taking the transistors being N-type transistors as an example.

Based on this, by taking the pixel circuit shown in FIG. 6 as an example, the method for detecting the threshold voltage Vth of the drive transistor Md in the pixel circuit through the above read line RL includes the following steps.

First, high level is output via the first gate line GL1 and the second gate line GL2 to turn on the first transistor T1 and the second transistor T2 respectively.

In this case, the data voltage Vdata, which is equal to 3V, input via the data line DL is written into the gate electrode (namely node A) of the drive transistor Md through the first transistor T1. At this time, the gate voltage Vg of the drive transistor Md meets: $Vg=V_A=Vdata$.

It will be noted that the above description is based on the example of the data voltage Vdata being equal to 3V. The value of the data voltage Vdata is not limited herein, and can be configured by a person skilled in the art according to the time between the turn-on and cut-off of the drive transistor Md in the display panel 01.

In addition, the read line RL is connected to an analog-to-digital converter (ADC) in the detection device 02, so that the reset voltage, such as 0V, is written into the source electrode (namely node B) of the drive transistor Md by the detection device 02 via the second transistor T2. At this time, the source voltage Vs of the drive transistor Md meets: $Vs=V_B=0V$.

In some embodiments, a gate switch is provided between the ADC and the read line RL to control the electrically connection or disconnection between the ADC and the read line RL through the gate switch.

Next, the drive transistor Md is turned on to start charging the read line RL. After a charge time, the gate source voltage Vgs of the drive transistor Md meets: $Vgs=Vth$, and then the drive transistor Md is cut off. At this time, the voltage on the read line RL is the source voltage Vs of the drive transistor Md, and meets: $Vs=Vg-Vth$, so that the threshold voltage Vth of the drive transistor Md is detected through the read line RL.

In this case, the read line RL is connected to a digital-to-analog converter (DAC) in the detection device 02, thereby outputting the threshold voltage Vth of the drive transistor Md read by the read line RL to the detection device 02 to complete the detection for the threshold voltage Vth of the drive transistor Md in the pixel circuit.

In some embodiments, a gate switch is provided between the DAC and the read line RL to control the electrically connection or disconnection between the DAC and the read line RL through the gate switch.

It can be seen from the above that, in order to increase the aperture ratio of the display area, sub-pixels 101 in a same pixel unit 100 is connected to a same read line RL. In this case, the sub-pixels 101 in the pixel unit 100 may sequentially receive the data voltages Vdata provided via the different data lines DL, so that the threshold voltages Vth of the drive transistors Md in the sub-pixels 101 in the pixel unit 100 may be detected separately. The detection process is the same as above, and will not be described herein.

Further, each row of the sub-pixels 101 is connected to a first gate line GL1 and a second gate line GL2. The gate signals are supplied to first gate lines GL1 and second gate lines GL2 of the sub-pixels 101 row by row during the detection process.

The light-emitting device L is for example an OLED device. In this case, the display panel 01 is an OLED display panel. Alternatively, the light-emitting device L is an LED or a Micro-LED, and in this case, the display panel 01 is a LED display panel.

On the basis of this, in some embodiments, in the case where the display panel 01 includes the first gate lines GL1 and the second gate lines GL2, as shown in FIG. 7, the display panel 01 further includes a plurality of gate detection terminals 31 disposed in the wiring area 61, and each gate detection terminal 31 is connected to a first gate line GL1 or a second gate line GL2. The gate detection terminals 31 are configured to receive the gate signals output by the detection device 02. For example, the detection device 02 includes gate drivers (Gate ICs) 51 which are capable of providing gate signals to the gate detection terminals 31.

Some embodiments of the present disclosure provide a detection system, and the detection system includes any one of the display panels 01 as described above and a detection device 02. The detection device 02 includes at least one source driver 50 connected to the pad groups 20 in the display panel 01. In this case, the detection device 02 is configured to output signals, such as the data voltages Vdata, to the data detection terminals 201 of the pad groups 20 via the at least one source driver 50.

In addition, as shown in FIG. 7, the detection device 02 further includes a plurality of gate drivers 51 arranged in orders. In the case where the display panel 01 includes gate detection terminals 31, each of the gate drivers 51 is electrically connected to a plurality of gate detection terminals 31 arranged in orders, and the gate detection terminals 31 electrically connected to any two of the gate drivers 51 are different, so that the gate drivers 51 may supply the gate signals to the first gate lines GL1 and the second gate lines GL2.

On the basis of this, it can be seen from above that the detection device 02 is also connected to the read detection terminals 30, so as to receive the collected signals from the read lines RL via the detection terminals 30.

In summary, the detection device 02 is configured to provide signals to the data lines DL, the first gate lines GL1 and the second gate lines GL2 in the display panel 01 so as to make the pixel circuits of the sub-pixels in the display panel 01 operate, and to collect the threshold voltages of the drive transistors Md in the pixel circuits through read lines RL. Then, the collected threshold voltages are compared with a reference value. In the case where the differences between one or a certain number of collected threshold voltages of the collected threshold voltages and the reference value are large and not in compliance with regulations, the display panel detected by the detection device 02 is determined to be unqualified, thereby achieving the purpose of detecting the unqualified product.

In some embodiments, the detection device 02 includes a plurality of source drivers 50 arranged side by side. The source drivers 50 are in one-to-one correspondence with the drive groups 10 in the display panel, and each of the source drivers 50 is electrically connected to data detection terminals 201 in a pad group 20 corresponding to the drive group 10.

For example, in a 4K display panel with a resolution of 4096×2160, the display area is divided into 20 drive groups 10. In this case, 20 source drivers 50 are arranged side by side in the detection device 02, and each of the source drivers 50 is electrically connected to one pad group 20 through probes, so that one source driver 50 corresponds to one drive group 10, and electrically connected to the plurality of columns of pixel units 100 in the drive group 10.

The above detection system has the same advantageous effects as the display panel provided in the foregoing embodiments, and details are not described herein again.

Further, in the case where the display panel includes read signal terminals 30, the source driver 50 is electrically connected to the read lines RL in the drive group 10 corresponding to the source driver 50 via the read signal terminals 30. That is, the sub-pixels 101 connected to the read lines RL connected to the same source driver 50 are all in the same drive group 10, thereby separately analyzing the threshold voltages collected from the sub-pixels of the different drive groups 10.

In some embodiments, the short wirings 202 and the pad groups 20 in the display panel are cut off after completing the detection of the threshold voltages Vth. In addition, in the drive bonding process, the source driver chip is bonded to a bonding pad 32 in FIG. 7.

Figure 8:
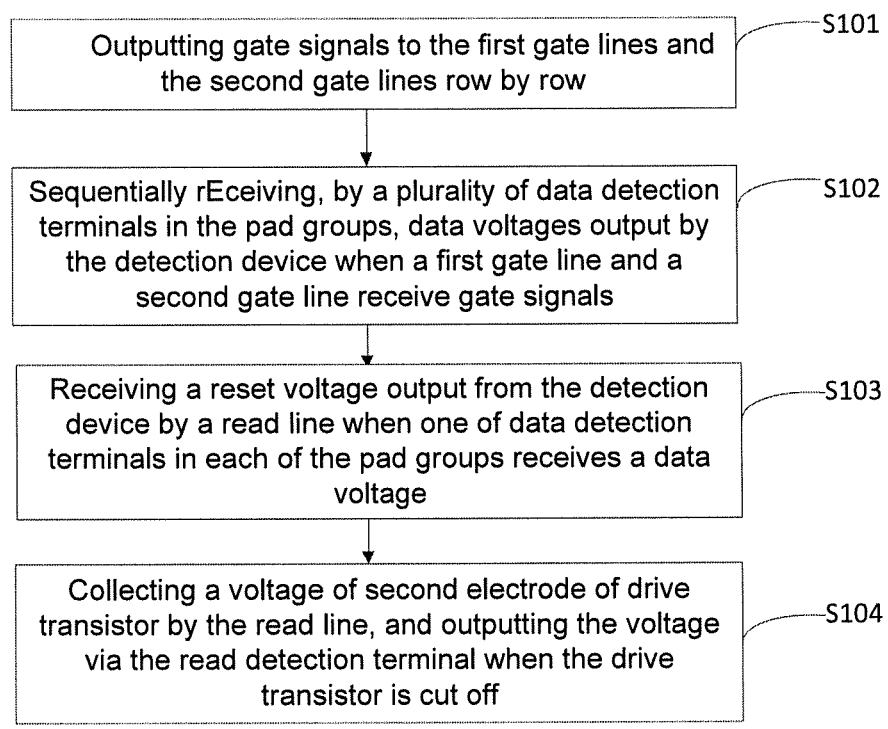
FIG. 8 is a flowchart of a method for detecting a display panel according to some embodiments of the present disclosure.

Some embodiments of the present disclosure provide a method for detecting any one of the display panels described above. The display panel 01 includes the read lines RL, the first gate lines GL1, and the second gate lines GL2, and the pixel circuits of the sub-pixels 101 include drive transistors Md. As shown in FIG. 8, the method includes steps 101-104 (S101-S104).

In S101, gate signals are output to the first gate lines GL1 and the second gate lines GL2 shown in FIG. 7 row by row.

In some embodiments, the TFTs of the sub-pixels connected to the gate lines are N-type transistors, and the gate signals are high level.

In S102, a plurality of data detection terminals 201 in the pad groups 20 sequentially receive data voltages Vdata output by the detection device 02 when a first gate line GL1 and a second gate line GL2 receive the gate signals.

For example, the first row of sub-pixels 101 is taken as an example. When the first gate line GL1 and the second gate line GL2 connected to the first row of sub-pixels 101 receive the gate signals, for a drive group 10, the data detection terminal 201 connected with the red (R) sub-pixel in the drive group 10 may receive the above data voltage Vdata first, and then the data detection terminals 201 respectively connected with the green (G) sub-pixel, the blue (B) sub-pixel and the white (W) sub-pixel in the drive group 10 may successively receive the above data voltages Vdata in the case where the pad group 20 includes four data detection terminals 201 as shown in FIG. 7.

In S103, a reset voltage output by the detection device 02 is received by a read line RL when one of the data detection terminals 201 in each of the pad groups 20 receives the data voltage Vdata.

For example, when the data detection terminal 201 connected to the red (R) sub-pixels in a drive group 10 receives the data voltage Vdata (for example, 3 V), the read line RL connected to the red (R) sub-pixel in the drive group 10 receives the reset voltage output from the detection device 02, such as 0V, so that the gate voltage Vg of the drive transistor Md in the pixel circuit of the red (R) sub-pixel shown in FIG. 6 is 3 V, and the source voltage Vs is 0 V.

In S104, the read line RL collects the voltage of the second electrode of the drive transistor Md, namely the source voltage Vs when the drive transistor Md is cut off, wherein the voltage meets: Vs=Vg−Vth, and outputs it through the read detection terminal 30. In this case, the purpose of detecting the threshold voltages of the drive transistors Md may be achieved.

It will be noted that when the data detection terminals 201 respectively connected to the green (G) sub-pixels, the blue (B) sub-pixels and the white (W) sub-pixels in the drive group successively receive the data voltage Vdata, the detection process of the threshold voltages in the sub-pixels of each color are the same as described above, and details are not described herein again.

In addition, the method for detecting the display panel provided by the embodiments of the present disclosure has the same beneficial effects as the display panel provided by the foregoing embodiments, and details are not described herein again.

The above embodiments are only exemplary embodiments of the present disclosure, but the protection scope of the present disclosure is not limited thereto, and any person skilled in the art can easily think of variations or replacements within the technical scope disclosed by the present disclosure, which are intended to be covered by the protection scope of the present disclosure. Therefore, the scope of protection of the present disclosure should be determined by the scope of the claims.

What is claimed is:

1. A display panel comprising:
   M drive groups disposed side by side in a display area, each drive group comprising a plurality of columns of pixel units, and each pixel unit comprising N sub-pixels, wherein, N is greater than or equal to 3, M is greater than or equal to 2, and M and N are positive integers; and
   M pad groups disposed in a wiring area around the display area, each pad group comprising N data detection terminals, wherein each data detection terminal is configured to receive a signal output from a detection device,
   wherein the pad groups are in one-to-one correspondence with the drive groups,
   sub-pixels having same color in a drive group of the drive groups are electrically connected to a data detection terminal of one of the pad groups corresponding to the drive group via data lines, and
   a plurality of read detection terminals disposed in the wiring area, and a plurality of read lines, wherein each read line is connected to one of the plurality of read detection terminals,
   wherein pixel circuits of sub-pixels in each pixel unit is connected to a same read line, the read line is configured to collect threshold voltages of drive transistors in the pixel circuits, and output the threshold voltages to the detection device via a corresponding read detection terminal, and
   wherein a pixel circuit of each sub-pixel in the display area comprises a first switch sub-circuit, a second switch sub-circuit, a drive sub-circuit and a light-emitting device, and the drive sub-circuit comprises a drive transistor, wherein
   the first switch sub-circuit is connected to a data line for controlling the sub-pixel, a first gate line of the gate lines and a gate electrode of the drive transistor, and is configured to output a data voltage provided by the data line to the gate electrode of the drive transistor under a control of the first gate line, the second switch sub-circuit is connected to a read line, a second gate line of the gate lines and a second electrode of the drive transistor, and is configured to output a voltage of the second electrode of the drive transistor to the read line under a control of the second gate line, and a first electrode of the drive transistor is connected to a first voltage end, the second electrode of the drive transistor is further connected to an anode electrode of the light-emitting device, and a cathode electrode of the light-emitting device is connected to a second voltage end.

2. The display panel according to claim 1, further comprising a plurality of short wirings disposed in the wiring area, wherein
an end of each short wiring is connected to a corresponding one of the data detection terminals, and an opposite end is connected to a corresponding one of data lines.

3. The display panel according to claim 2, further comprising gate lines disposed in the display area, wherein the gate lines and the data lines intersect, and are in a same layer and of a same material.

4. The display panel according to claim 1, wherein, the first switch sub-circuit comprises a first transistor;
a gate electrode of the first transistor is connected to the first gate line, a first electrode of the first transistor is connected to the data line and a second electrode of the first transistor is to the gate electrode of the drive transistor.

5. The display panel according to claim 1, wherein, the second switch sub-circuit comprises a second transistor;
a gate electrode of the second transistor is connected to the second gate line, a first electrode of the second transistor is connected to the second electrode of the drive transistor, and a second electrode of the first electrode is connected to the read line.

6. The display panel according to claim 1, wherein, the drive sub-circuit further comprises a storage capacitor, a first end of the storage capacitor is connected to the electrode gate of the drive transistor, and an opposite end is connected to the second electrode of the drive transistor.

7. The display panel according to claim 1, further comprising a plurality of gate detection terminals disposed in the wiring area, wherein each gate detection terminal is connected to a first gate line or a second gate line of the gate lines, and the gate detection terminals are configured to receive gate signals output from the detection device.

8. A detection system, comprising a detection device and the display panel according to claim 1, wherein, the detection device comprises at least one source driver electrically connected to the pad groups in the display panel.

9. The detection system according to claim 8, wherein, the at least one source driver comprises a plurality of source drivers arranged side by side,
the source drivers are in one-to-one correspondence with the drive groups in the display panel, and each source driver is connected to data detection terminals in a pad group corresponding to a corresponding drive group.

10. The detection system according to claim 9, wherein, the display panel comprises read signal terminals,
each source driver is electrically connected, via read signal terminals, to read lines connected to pixel circuits of sub-pixels in a drive group corresponding to the source driver.

11. The detection system according to claim 8, wherein, the detection device further comprises a plurality of gate drivers arranged side by side;
the display panel comprises gate detection terminals, each gate driver is connected to a plurality of gate detection terminals of the gate detection terminals arranged sequentially;
gate detection terminals electrically connected to any two of the plurality of gate drivers are different.

12. A method for detecting the display panel according to claim 1, the display panel comprising read lines, first gate lines and second gate lines, pixel circuits of sub-pixels comprising drive transistors, and the method comprising:
outputting gate signals to the first gate lines and the second gate lines row by row;
sequentially receiving, by a plurality of data detection terminals in the pad groups, data voltages output by the detection device when a first gate line and a second gate line receive gate signals;
receiving a reset voltage output from the detection device by a read line when one of data detection terminals in each of the pad groups receives a data voltage;
collecting a voltage of a second electrode of a drive transistor by the read line, and outputting the voltage via a read detection terminal when the drive transistor is cut off.

* * * * *